United States Patent
Aurongzeb et al.

(10) Patent No.: US 10,809,450 B2
(45) Date of Patent: Oct. 20, 2020

(54) DISPLAY DEVICE BLUE LIGHT EMISSION MANAGEMENT SYSTEM

(71) Applicant: Dell Products L.P., Round Rock, TX (US)

(72) Inventors: Deeder M. Aurongzeb, Austin, TX (US); Stefan Peana, Austin, TX (US)

(73) Assignee: Dell Products L.P., Round Rock, TX (US)

(*) Notice: Subject to any disclaimer, the term of this patent is extended or adjusted under 35 U.S.C. 154(b) by 168 days.

(21) Appl. No.: 15/882,750

(22) Filed: Jan. 29, 2018

(65) Prior Publication Data

US 2019/0235152 A1 Aug. 1, 2019

(51) Int. Cl.
*G02F 1/1335* (2006.01)
*F21V 8/00* (2006.01)
*H01L 27/15* (2006.01)

(52) U.S. Cl.
CPC .......... *G02B 6/0068* (2013.01); *G02B 6/005* (2013.01); *G02B 6/0053* (2013.01); *G02B 6/0055* (2013.01); *G02B 6/0073* (2013.01); *G02F 1/1335* (2013.01); *H01L 27/15* (2013.01)

(58) Field of Classification Search
None
See application file for complete search history.

(56) References Cited

U.S. PATENT DOCUMENTS

| | | | | |
|---|---|---|---|---|
| 2003/0223218 | A1* | 12/2003 | Kawakami | G02B 6/0016 362/612 |
| 2006/0001036 | A1* | 1/2006 | Jacob | G02B 6/0003 257/98 |
| 2011/0299012 | A1* | 12/2011 | Wang | F21S 8/00 349/65 |
| 2013/0242607 | A1* | 9/2013 | Lai | G02F 1/1336 362/611 |
| 2014/0071381 | A1* | 3/2014 | Jang | G02B 6/0051 349/64 |
| 2014/0340865 | A1* | 11/2014 | Hikmet | G02F 1/133533 362/19 |
| 2017/0242179 | A1* | 8/2017 | Satake | G02B 6/005 |
| 2017/0256591 | A1* | 9/2017 | Li | G02F 1/133516 |
| 2017/0256686 | A1* | 9/2017 | Li | H01L 33/44 |
| 2018/0246377 | A1* | 8/2018 | Fan | G02F 1/133603 |

OTHER PUBLICATIONS

"PL-BLU Anti-Blue Light Screen Filter," 2018, pp. 1-5, Fiara Pty Ltd., http://fiara.com.au/pl-blu-anti-blue-light-screen-filter/?setCurrencyId=4.

* cited by examiner

*Primary Examiner* — Andrew J Coughlin
(74) *Attorney, Agent, or Firm* — Haynes and Boone, LLP

(57) ABSTRACT

A blue light emissions management system includes a blue light emitting device that is configured to emit blue light. The blue light emissions management system also includes a display screen stack that is located adjacent the blue light emitting device and that is configured to receive blue light emitted from the blue light emitting diode. The display screen stack includes a doped layer that includes a doping material in a doping amount that configures the doped layer to convert a first portion of the blue light received by the display screen stack to at least one of red light and green light.

20 Claims, 10 Drawing Sheets

TOP POLARIZER LAYER 506

OPTICALLY CLEAR ADHESIVE (OCA) SUB-LAYER 507a

BLUE FILTER SUB-LAYER 507b

POLYVINYL ALCOHOL (PVA) PROTECTIVE SUB-LAYER 507c

TRI-ACETATE CELLULOSE (TAC) SUB-LAYER 507d

OPTICALLY CLEAR ADHESIVE (OCA) SUB-LAYER 507e

COLOR FILTER GLASS SUB-LAYER 507f

COLOR FILTER LAYER 508

FIG. 5B

| | |
|---|---|
| TOP POLARIZER LAYER 506 | |
| OPITICALLY CLEAR ADHESIVE (OCA) SUB-LAYER 507a | |
| BLUE FILTER SUB-LAYER 507b | |
| POLYVINYL ALCOHOL (PVA) PROTECTIVE SUB-LAYER 507c | |
| DOPED TRI-ACETATE CELLULOSE (TAC) LAYER 507g | |
| OPTICALLY CLEAR ADHESIVE (OCA) SUB-LAYER 507e | |
| COLOR FILTER GLASS SUB-LAYER 507f | |
| COLOR FILTER LAYER 508 | |

FIG. 5C

DISPLAY DEVICE BLUE LIGHT EMISSION MANAGEMENT SYSTEM

BACKGROUND

The present disclosure relates generally to information handling systems, and more particularly to managing the emission of blue light from display devices used in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems include display devices that are utilized for displaying information generated by the information handling system. For example, many conventional display devices such as televisions, displays on personal computing devices, display devices on mobile phones, etc., utilize Light Emitting Devices (LEDs) in their display screens in order to provide the backlight for those display devices. In particular, blue LEDs coated with yellow phosphor are often used for such backlighting, with the blue light photons emitted by the blue LED either traveling through the yellow phosphor coating unchanged, or being converted to yellow light photons by the yellow phosphor coating. Those blue and yellow light photons then combine to produce white light that is directed through a light guide and the layers of the display screen before being emitted from the display. However, the use of blue LEDs in display devices raises some issues. For example, the blue light photons in the white light emitted from the yellow-phosphor-coated blue LEDs have been found to disrupt circadian rhythm, produce macular degeneration of user's retina, accelerate glaucoma, and introduce a number of other harmful side effects. Conventional solutions to such blue light issues involve introducing blue filter layers into the display device to filter certain blue light spectrum ranges or to reduce the amount of blue light energy output. However, the use of conventional blue light filters results in increased display device thickness and a reduction in display brightness output (ex: a 15% reduction of blue light will reduce the display brightness output by 10% to 12%). Additionally, reduction of blue light alone will offset the RGB ratio, shifting the white point proportionally and impacting the display image quality output.

Accordingly, it would be desirable to provide an improved display device blue light emission management system.

SUMMARY

According to one embodiment, an Information Handling System (IHS) includes a processing system; a memory system that is coupled to the processing system and that includes instructions that, when executed by the processing system, cause the processing system to generate display information; and a display device that is coupled to the processing system and that is configured to receive the display information, wherein the display device includes: a blue light emitting device that is configured to emit blue light in order to provide for the display of the display information; and a display screen stack that is located adjacent the blue light emitting device and that is configured to receive blue light emitted from the blue light emitting diode, wherein the display screen stack includes a doped layer that includes a doping material in a doping amount that configures the doped layer to convert a first portion of the blue light received by the display screen stack to at least one of red light and green light.

BRIEF DESCRIPTION OF THE DRAWINGS

FIG. 5B is a schematic view illustrating an embodiment of layers in the display device of FIG. 5A.

FIG. 5C is a schematic view illustrating an embodiment of layers in the display device of FIG. 5A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
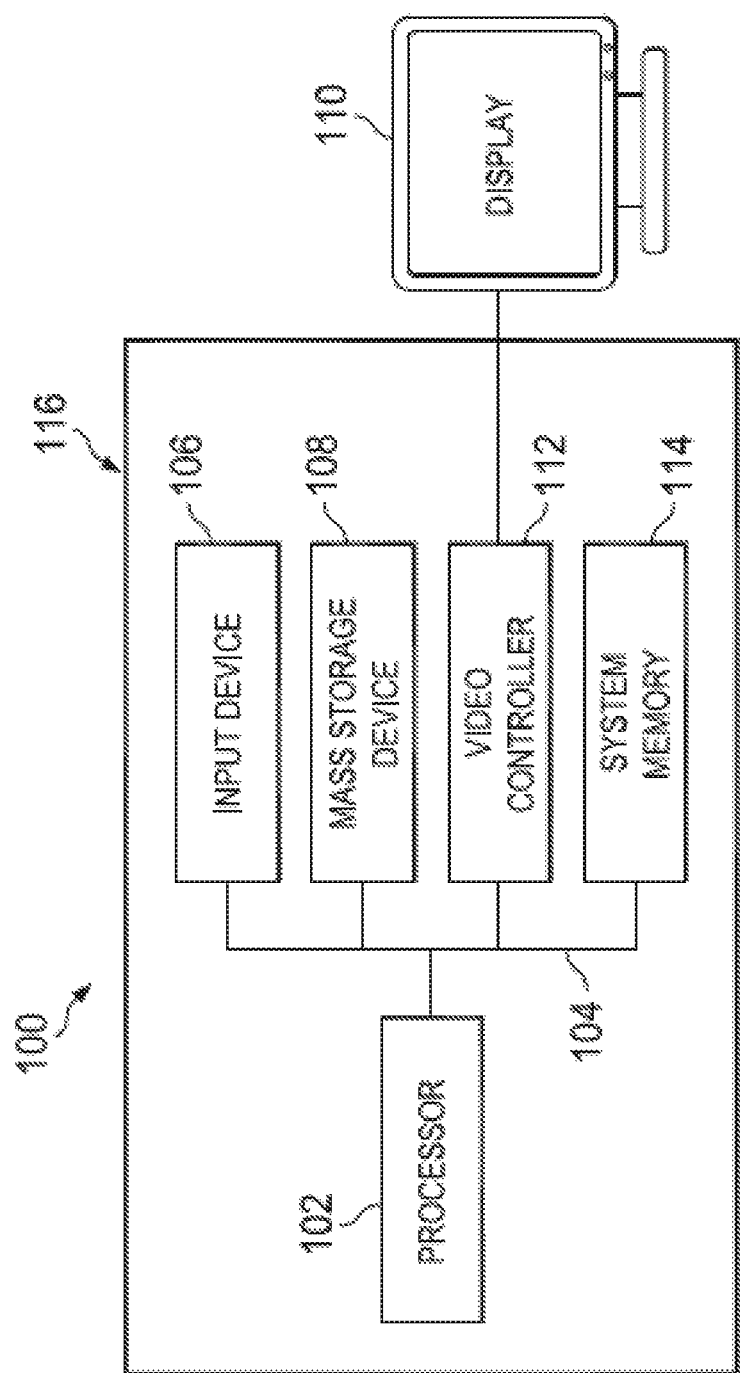
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
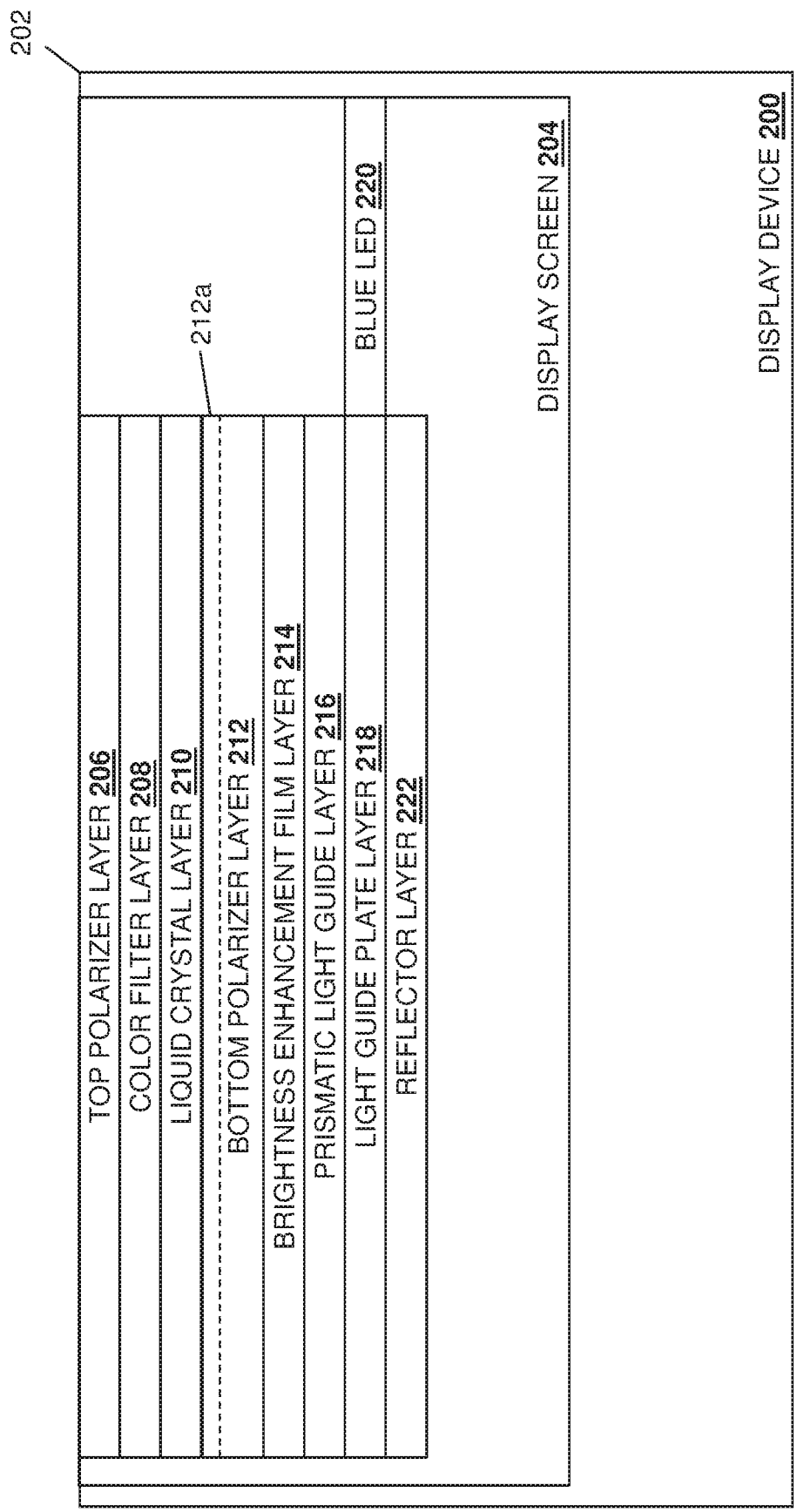
FIG. 2 is a schematic view illustrating an embodiment of a display device.

Referring now to FIG. 2, an embodiment of a display device 200 is illustrated that may be included on or coupled to the information handling system 100 discussed above with reference to FIG. 1 (e.g., the display 110), and in specific examples may be provided as part of, or along with, information handling systems such as, for example, televisions, desktop computing devices, laptop/notebook computing devices, tablet computing device, mobile phones, and/or other devices known in the art that include or utilize display screens. As discussed below, the display device 200 of FIG. 2 provides an embodiment of the provisioning of novel blue filtering capability in a display screen stack via deposition or coating to provide such blue filtering capability on a polarizing layer, or doping of that polarizing layer, which solves some of the problems discussed above with conventional blue filters used in display screens. As would be appreciated by one of skill in the art, the embodiment of the display device 200 of FIG. 2 may be modified and/or combined with the other embodiments discussed below while remaining within the scope of the present disclosure.

In the illustrated embodiment, the display device 200 is described as a Liquid Crystal Display (LCD) device that includes a chassis 202 that houses the components of the display device 200, only some of which are illustrated in FIG. 2. However, other types of display devices may benefit from the teachings of the present disclosure, and thus are envisioned as falling within its scope. In the illustrated example, the display device 200 houses a display screen 204. In some examples, the display screen 204 may be coupled to a processing system (not illustrated, but which may include the processor 102 discussed above with reference to FIG. 1) that is further coupled to a memory system (not illustrated, but which may include the memory 114 discussed above with reference to FIG. 1) that includes instructions that, when executed by the processing system, cause the processing system to generate display information and provide that display information to the display screen 204. As such, the display screen 204 is configured to provide such display information for display.

The display screen 204 may be provided by a display screen stack having a plurality of different layers. For example, in the illustrated embodiment, the display screen stack includes a top polarizer layer 206 that may provide an optical filter that is configured to allow light waves having a first polarization to pass through while blocking light waves having other polarizations. The display screen stack also includes a color filter layer 208 that is located adjacent the top polarizer layer 206 and that may provide respective red, green, and blue filters for each sub-pixel that is part of a pixel on the display screen 204, and that operate to define the color emitted by that pixel. The display screen stack also includes a liquid crystal layer 210 that is located adjacent the color filter layer 208 and that may provide liquid crystal molecules for each pixel in the display screen 204, with those liquid crystal molecules configured to have their orientations modified via the application of an electrical field (e.g., a voltage across the liquid crystal molecule) in order to control the amount of light passed through to the color filter layer 208. The display screen stack also includes a bottom polarizer layer 212 that is located adjacent the liquid crystal layer 210 and that may provide an optical filter that is configured to allow light waves having a second polarization to pass through while blocking light waves having other polarizations, with that second polarization typically orientated 90 degrees relative to the first polarization of the top polarizing layer 206.

In addition, a blue filter 212a may be provided with the bottom polarizing layer 212. For example, the blue filter 212a may be provided with the bottom polarizing layer 212 by deposited a blue filtering material such as, for example, 1) Zinc Oxide, Gallium Oxide, and/or combinations thereof with less than a 10 nanometer thickness, or 2) Silver nanoparticles less than 20 nanometer in size, on a surface of the bottom polarizing layer 212 via a 10-100 nanometer nanoparticle vapor deposition process, a 10-100 nanometer nanoparticle e-beam deposition process, and/or a variety of other processes that would be apparent to one of skill in the art in possession of the present disclosure. In another example, the blue filter 212a may be provided with the bottom polarizing layer 212 by doping the bottom polarizing layer 212 with a blue filtering material such as 1) Zinc Oxide, Gallium Oxide, and/or combinations thereof with less than a 10 nanometer thickness, or 2) Silver nanoparticles less than 20 nanometer in size, via a 10-100 nanometer nanoparticle diffusion process and/or a variety of other doping processes that would be apparent to one of skill in the art in possession of the present disclosure. While the blue filter 212a is illustrated as deposited on or doped adjacent a particular surface of the bottom polarizer 212 (i.e., the surface of the bottom polarizer 212 immediately adjacent the liquid crystal layer 210), the blue filter 212a may be deposited on or doped adjacent a different surface of the bottom polarizer 212 (e.g., the surface of the bottom polarizer layer 212 immediately adjacent the brightness enhancement film layer 214, discussed below), or doped in different volumes (or throughout) the bottom polarizer layer 212 while remaining within the scope of the present disclosure.

The display screen stack also includes a brightness enhancement film layer 214 that is located adjacent the bottom polarizer layer 212 and that may include a prismatic film that is configured to manage the angular output of light that passes through the brightness enhancement film layer 214 by refracting light that is within a viewing cone/angle out of the display screen 204, and reflecting light that is outside the viewing cone/angle back to the reflector layer 222 (discussed below) for "recycling" until that light enters the brightness enhancement film layer 214 within the viewing cone/angle such that it is allowed to pass out of the display screen 204, thus increasing the brightness and efficiency of the display screen 204. In different examples, the brightness enhancement film layer 214 may include one or more of a Brightness Enhancement Film (BEF), a Dual Brightness Enhancement Film (DBEF), a DBEF II, and a DBEF QV2 with Optically Clear Adhesive (OCA), all available from 3M Company of Maplewood, Minn., United States.

The display screen stack also includes a prismatic light guide layer 216 located between the brightness enhancement film layer 214 and a light guide plate layer 218 that is also included in the display screen stack. As illustrated, one or more blue light emitting devices (LEDs) 220 that are configured to emit blue light may be positioned adjacent the light guide plate 218 such that blue light emitted from the blue LED(s) 220 enters the light guide plate layer 218. In a specific example, the light guide plate layer 218 includes a Polymethyl methacrylate (PMMA) material that is configured to propagate the blue light received from the blue LED(s) 220 via total internal reflection, and distribute that blue light such that it exits the light guide plate layer 218 across the surface of the light guide plate layer 218 that is adjacent the prismatic light guide layer 216, with prismatic light guide layer 216 (which may be separate from the light guide plate layer 218 or integrated with the light guide plate layer 218) configured to guide the blue light towards the surface of the display screen stack while dispersing it uniformly across the display screen. However, other light guide components and configurations (i.e., other than the light guide plate layer 218 and prismatic light guide layer 216 in this example) may be utilized while remaining within the scope of the present disclosure.

The display screen stack also includes a reflector layer 222 that is located adjacent the light guide plate layer 218 and that is configured to reflect blue light that propagated through the light guide plate layer 218 such that it eventually exits the light guide plate layer 218 across the surface of the light guide plate layer 218 that is adjacent the prismatic light guide layer 216. In a specific example, the reflector layer 222 may include an Enhanced Specular Reflector available from 3M Company of Maplewood, Minn., United States. While a display device 200 has been described, one of skill in the art in possession of the present disclosure will recognize that display devices may include different components and/or component configuration for providing conventional display device functionality, as well as the functionality described below, while remaining within the scope of the present disclosure. In particular, while a particular display screen stack is illustrated and described, one of skill in the art will recognize that the some layers in the display screen stack may be omitted, additional layers maybe added to the display screen stack, some layers may be provided in different positions in the display screen stack, and layers in the display screen stack may include sub-layers, while remaining within the scope of the present disclosure.

Figure 3:
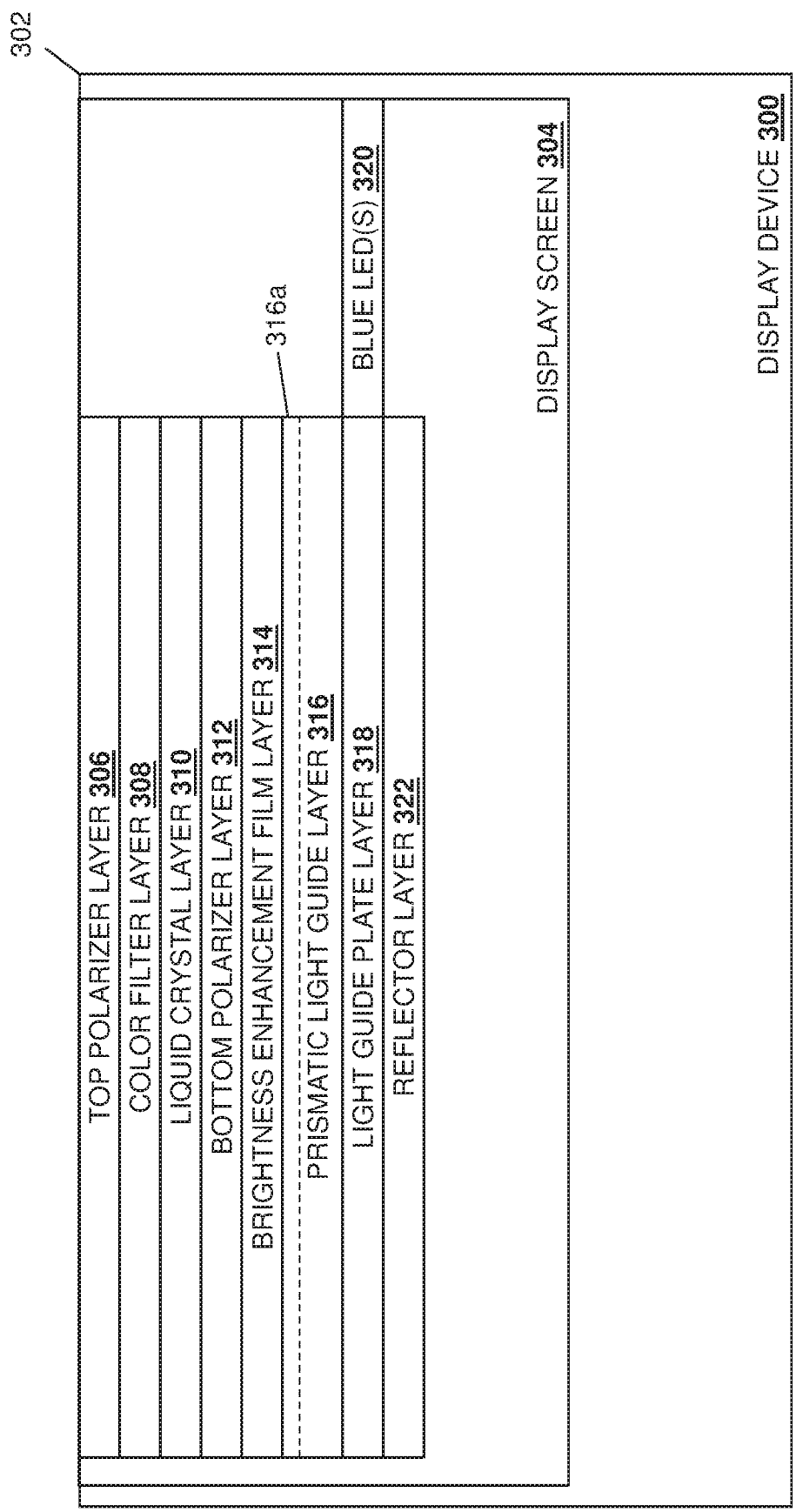
FIG. 3 is a schematic view illustrating an embodiment of a display device.

Referring now to FIG. 3, an embodiment of a display device 300 is illustrated that may be included on or coupled to the information handling system 100 discussed above with reference to FIG. 1 (e.g., the display 110), and in specific embodiments may be provided as part of, or along with, information handling systems such as, for example, televisions, desktop computing devices, laptop/notebook computing devices, tablet computing device, mobile phones, and/or other devices known in the art that include or utilize display screens. As discussed below, the display device 300 of FIG. 3 provides an embodiment of the provisioning of novel blue filtering in a display screen stack that may be provided via deposition on a prismatic light guide layer or doping of that prismatic light guide layer, which solves some of the problems discussed above with conventional blue filters used in display screens. As would be appreciated by one of skill in the art, the embodiment of the display device 300 of FIG. 3 may be modified and/or combined with the other embodiments discussed below while remaining within the scope of the present disclosure.

In the illustrated embodiment, the display device 300 is described as a Liquid Crystal Display (LCD) that includes a chassis 302 that houses the components of the display device 300, only some of which are illustrated in FIG. 3. However, other types of display devices may benefit from the teachings of the present disclosure, and thus are envisioned as falling within its scope. In the illustrated example, the display device 300 houses a display screen 304. In some examples, the display screen 304 may be coupled to a processing system (not illustrated, but which may include the processor 102 discussed above with reference to FIG. 1) that is further coupled to a memory system (not illustrated, but which may include the memory 114 discussed above with reference to FIG. 1) that includes instructions that, when executed by the processing system, cause the processing system to generate display information and provide that display information to the display screen 304. As such, the display screen 304 is configured to provide such display information for display.

The display screen 304 may be provided by a display screen stack having a plurality of different layers. For example, in the illustrated embodiment, the display screen stack includes a top polarizer layer 306, a color filter layer 308, a liquid crystal layer 310, a brightness enhancement film layer 314, a light guide plate layer 318, and a reflector layer 322, each of which is similar to (and operates similarly as explained above for) the top polarizer layer 206, the color filter layer 208, the liquid crystal layer 210, the brightness enhancement film layer 214, the light guide plate layer 218, and the reflector layer 222 discussed above with reference to FIG. 2. In addition, the display screen 304 includes blue LED(s) 320 that are similar to (and operate similarly as explained above for) the blue LED(s) 220 discussed above with reference to FIG. 2. However, in contrast to the display screen stack provided in the display screen 204 of the display device 200, the display screen stack in the display screen 304 includes a bottom polarizer layer 312 that is similar to (and operates similarly as explained above for) the bottom polarization layer 212 that is discussed above with reference to FIG. 2, but that does not include the blue filter 212a that is provided via doping or deposition on the surface of the bottom polarization layer 212.

In addition, the display screen stack in the display screen 304 includes a prismatic light guide layer 316 that is similar to (and operates similarly as explained above for) the prismatic light guide layer 216 that is discussed above with reference to FIG. 2, but with the addition of a blue filter 316a. For example, the blue filter 316a may be provided with the prismatic light guide layer 316 by deposited a blue filtering material such as, for example, 1) Zinc Oxide, Gallium Oxide, and/or combinations thereof with less than a 10 nanometer thickness, or 2) Silver nanoparticles less than 20 nanometer in size, on a surface of the prismatic light guide layer 316 via a 10-100 nanometer vapor deposition process, a 10-100 nanometer e-beam deposition process, a diffusion process, and/or a variety of other deposition processes that would be apparent to one of skill in the art in possession of the present disclosure. In another example, the blue filter 316a may be provided with the prismatic light guide layer 316 by doping the prismatic light guide layer 316 with a blue filtering material such as 1) Zinc Oxide, Gallium Oxide, and/or combinations thereof with less than a 10 nanometer thickness, or 2) Silver nanoparticles less than 20 nanometer in size, via a 10-100 nanometer nanoparticle diffusion process, and/or a variety of other doping processes that would be apparent to one of skill in the art in possession of the present disclosure. While the blue filter 316a is illustrated as deposited on or doped adjacent a particular surface of the prismatic light guide layer 316 (i.e., the surface of the prismatic light guide layer 316 immediately adjacent the brightness enhancement film layer 314), the blue filter 316a may be deposited on or doped adjacent a different surface of the prismatic light guide layer 316 (e.g., the surface of the prismatic light guide layer 316 immediately adjacent the light guide plate layer 318, discussed below), or doped in different volumes (or throughout) the prismatic light guide layer 316 while remaining within the scope of the present disclosure.

Figure 4A:
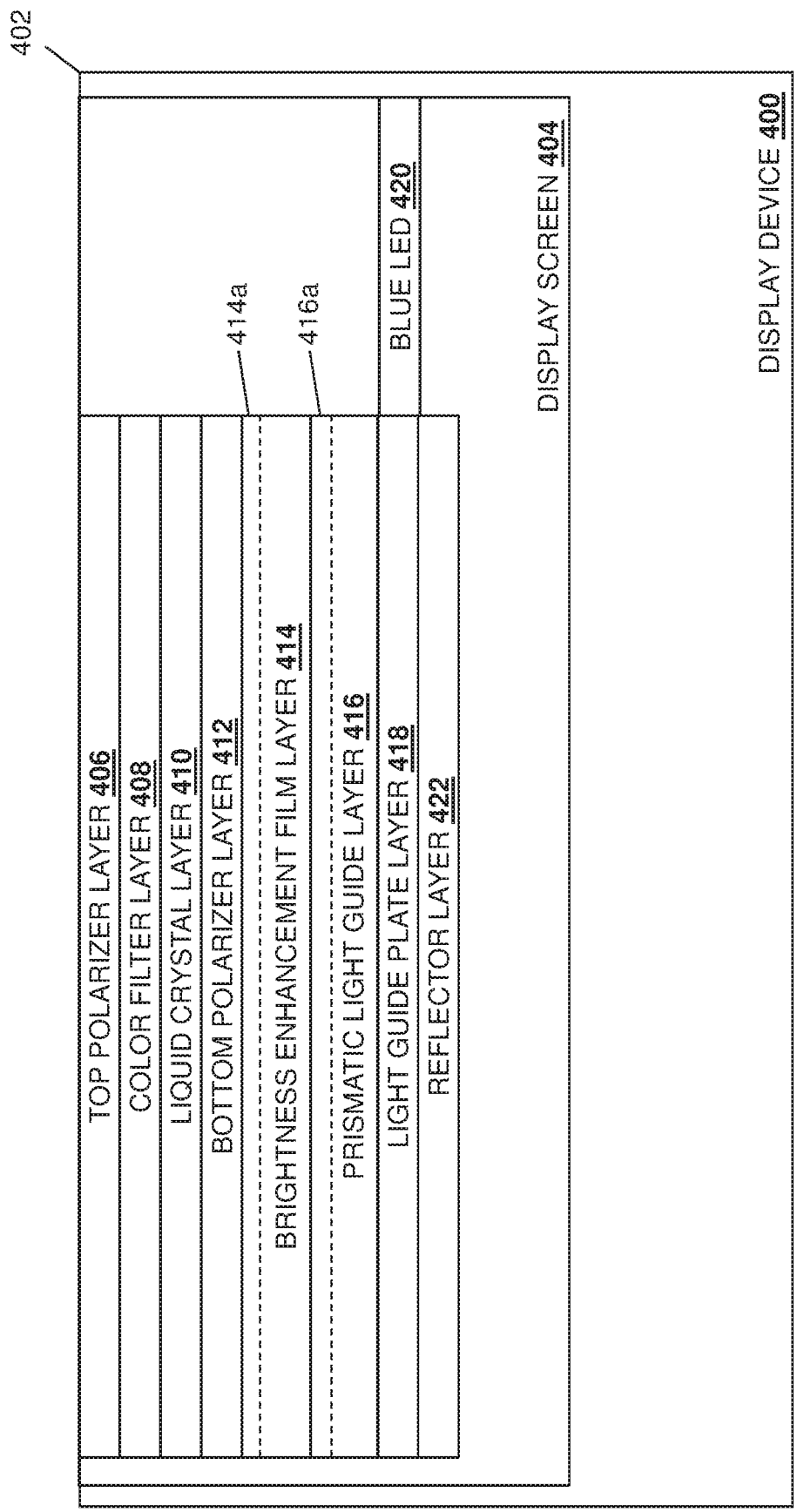
FIG. 4A is a schematic view illustrating an embodiment of a display device.
Figure 4B:
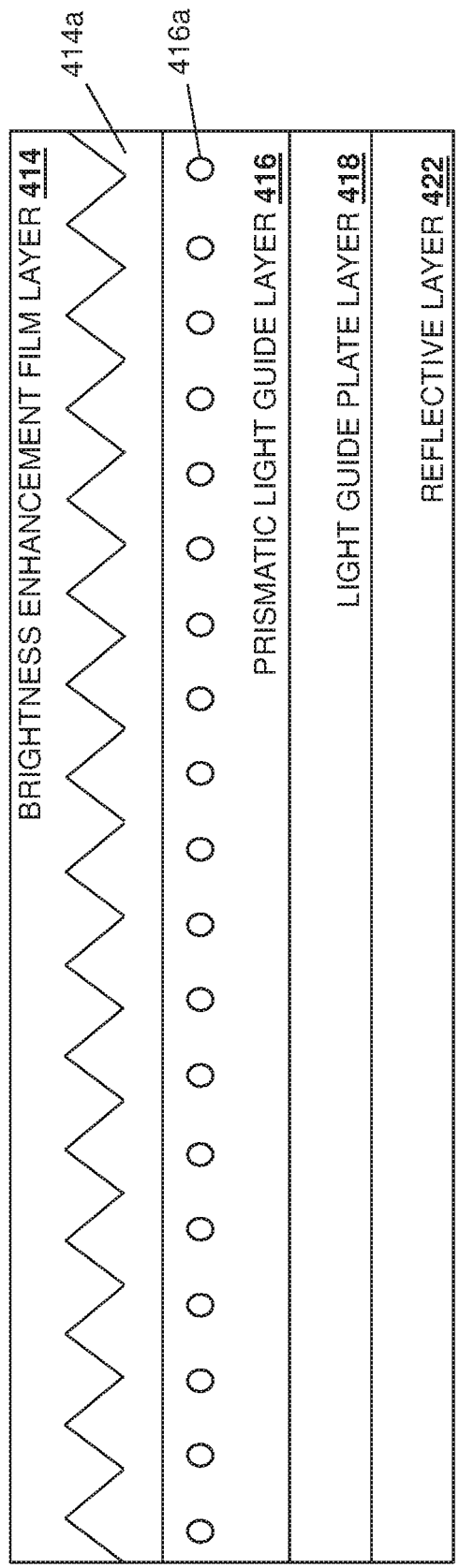
FIG. 4B is a schematic view illustrating an embodiment of layers in the display device of FIG. 4A.

Referring now to FIGS. 4A and 4B, an embodiment of a display device 400 is illustrated that may be included on or coupled to the information handling system 100 discussed above with reference to FIG. 1 (e.g., the display 110), and in specific examples may be provided as part of, or along with, information handling systems such as, for example, televisions, desktop computing devices, laptop/notebook computing devices, tablet computing device, mobile phones, and/or other devices known in the art that include or utilize display screens. As discussed below, the display device 400 of FIGS. 4A and 4B provides an embodiment of a doped prismatic light guide layer which solves some of the problems discussed above with conventional blue filters used in display screens. As would be appreciated by one of skill in the art, the embodiment of the display device 400 of FIGS. 4A and 4B may be modified and/or combined with the other embodiments discussed below while remaining within the scope of the present disclosure.

In the illustrated embodiment, the display device 400 is described as a Liquid Crystal Display (LCD) that includes a chassis 402 that houses the components of the display device 400, only some of which are illustrated in FIGS. 4A and 4B. However, other types of display devices may benefit from the teachings of the present disclosure, and thus are envisioned as falling within its scope. In the illustrated example, the display device 400 houses a display screen 404. In some examples, the display screen 404 may be coupled to a processing system (not illustrated, but which may include the processor 102 discussed above with reference to FIG. 1) that is further coupled to a memory system (not illustrated, but which may include the memory 114 discussed above with reference to FIG. 1) that includes instructions that, when executed by the processing system, cause the processing system to generate display information and provide that display information to the display screen 404. As such, the display screen 404 is configured to provide such display information for display.

The display screen 404 may be provided by a display screen stack having a plurality of different layers. For example, in the illustrated embodiment, the display screen stack includes a top polarizer layer 406, a color filter layer 408, a liquid crystal layer 410, a brightness enhancement film layer 414, a light guide plate layer 418, and a reflector layer 422, each of which is similar to (and operates similarly as explained above for) the top polarizer layer 206, the color filter layer 208, the liquid crystal layer 210, the brightness enhancement film layer 214, the light guide plate layer 218, and the reflector layer 222 discussed above with reference to FIG. 2. In addition, the display screen 404 includes blue LED(s) 420 that are similar to (and operate similarly as explained above for) the blue LED(s) 220 discussed above with reference to FIG. 2. However, in contrast to the display screen stack provided in the display screen 204 of the display device 200, the display screen stack in the display screen 404 includes a bottom polarizer layer 412 that is similar to (and operates similarly as explained above for) the bottom polarization layer 212 that is discussed above with reference to FIG. 2, but that does not include the blue filter 212a that is provided via doping or deposition on the surface of the bottom polarization layer 212. In the embodiment illustrated in FIGS. 4A and 4B, element 414a provides an indication of a reflective property of the brightness enhancement film layer 414, discussed in further detail below In addition, the display screen stack in the display screen 404 includes a prismatic light guide layer 416 that is similar to (and operates similarly as explained above for) the prismatic light guide layer 216 that is discussed above with reference to FIG. 2, but that has been doped (as indicated by elements 416b in FIGS. 4A and 4B.) For example, the prismatic light guide layer 316 may be doped with doping materials such as phosphor, quantum dots, and/or other blue-filtering doping materials via a 10-100 nanometer nanoparticle diffusion process and/or a variety of other doping processes that would be apparent to one of skill in the art in possession of the present disclosure. In an embodiment, the doping material may be provided in a doping amount that configures the prismatic light guide layer 416 to function as discussed below. For example, depending on the material used for the prismatic light guide layer 416 (e.g., Polyvinyl alcohol (PVA), Cyclic olefin copolymer (COC), etc.) a doping amount of 5-10% may be appropriate, although other doping amounts are envisioned as falling within the scope of the present disclosure. While the doping 416a is illustrated as located adjacent a particular surface of the prismatic light guide layer 416 (i.e., the surface of the prismatic light guide layer 416 immediately adjacent the brightness enhancement film layer 414), the doping 416a may be provided adjacent a different surface of the prismatic light guide layer 416 (e.g., the surface of the prismatic light guide layer 416 immediately adjacent the light guide plate layer 418, discussed below), or doped in different volumes (or throughout) the prismatic light guide layer 416 while remaining within the scope of the present disclosure.

Figure 5A:
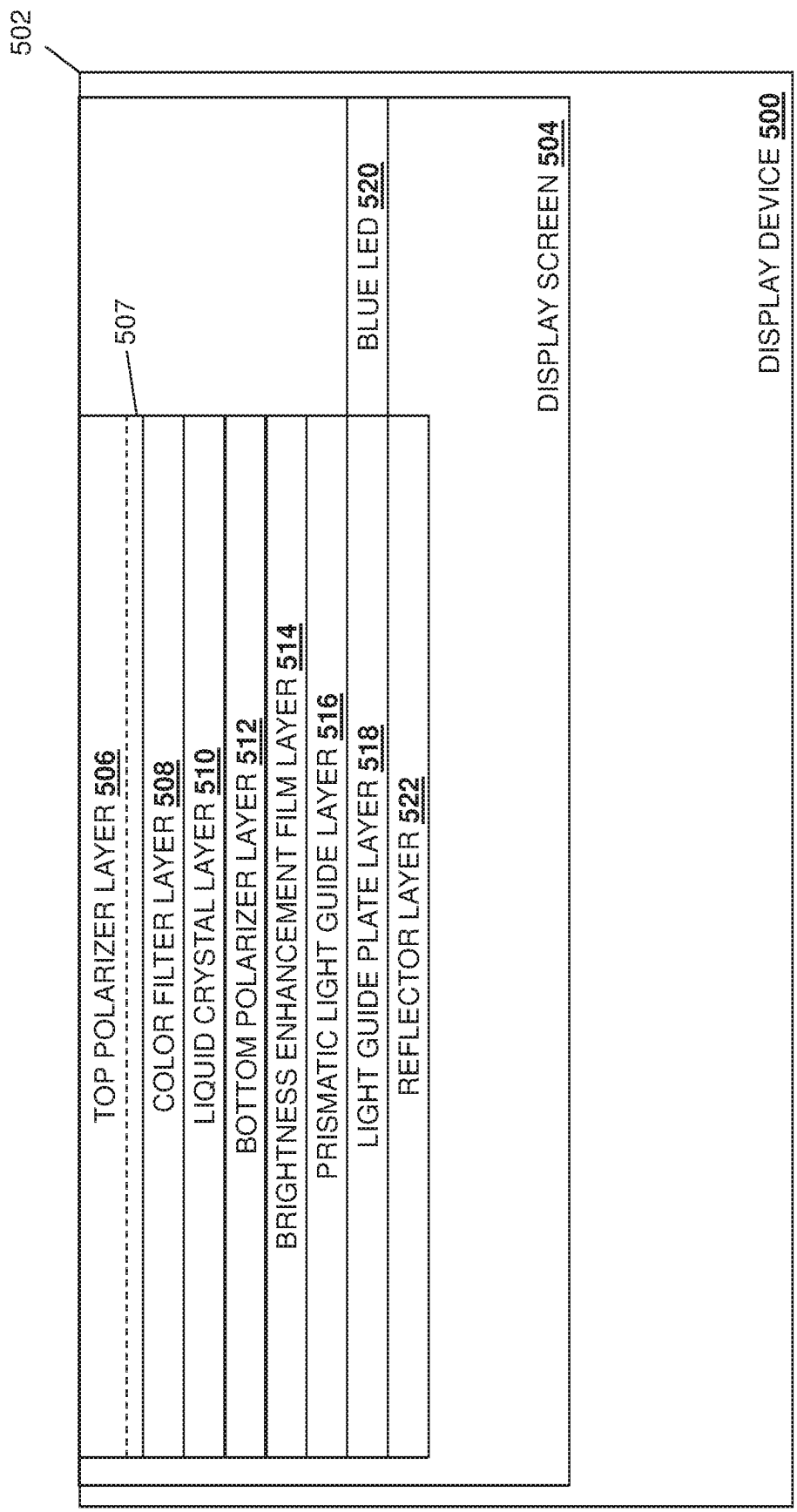
FIG. 5A is a schematic view illustrating an embodiment of a display device.

Referring now to FIG. 5A, an embodiment of a display device 500 is illustrated that may be included on or coupled to the information handling system 100 discussed above with reference to FIG. 1 (e.g., the display 110), and in specific embodiments may be provided as part of, or along with, information handling systems such as, for example, televisions, desktop computing devices, laptop/notebook computing devices, tablet computing device, mobile phones, and/or other devices known in the art that include or utilize display screens. As discussed below, the display device 500 of FIGS. 5A and 5B provides an embodiment of the provisioning of novel blue filtering in a polarizer layer by replacing a Tri-Acetate Cellulose (TAC) sub-layer in that polarizer layer with a blue filter, which solves some of the problems discussed above with conventional blue filters used in display screens. As also discussed below, the display device 500 of FIGS. 5A and 5C provides an embodiment of the provisioning of novel blue filtering and light recycling by replacing a Tri-Acetate Cellulose (TAC) sub-layer in that polarizer layer a blue filter and doping a TAC sub-layer in that polarizer layer, which solves some of the problems discussed above with conventional blue filters used in display screens. As would be appreciated by one of skill in the art, the embodiment of the display device 500 of FIG. 5A and either of 5B or 5C may be modified and/or combined with the other embodiments discussed below while remaining within the scope of the present disclosure.

In the illustrated embodiment, the display device 500 is described as a Liquid Crystal Display (LCD) that includes a chassis 502 that houses the components of the display device 500, only some of which are illustrated in FIG. 5A. However, other types of display devices may benefit from the teachings of the present disclosure, and thus are envisioned as falling within its scope. In the illustrated example, the display device 500 houses a display screen 504. In some examples, the display screen 504 may be coupled to a processing system (not illustrated, but which may include the processor 102 discussed above with reference to FIG. 1) that is further coupled to a memory system (not illustrated, but which may include the memory 114 discussed above with reference to FIG. 1) that includes instructions that, when executed by the processing system, cause the processing system to generate display information and provide that display information to the display screen 504. As such, the display screen 504 is configured to provide such display information for display.

The display screen 504 may be provided by a display screen stack having a plurality of different layers. For example, in the illustrated embodiment, the display screen stack includes a color filter layer 508, a liquid crystal layer 510, a brightness enhancement film layer 516, a prismatic light guide layer 518, a light guide plate layer 418, and a reflector layer 422, each of which is similar to (and operates similarly as explained above for) the color filter layer 208, the liquid crystal layer 210, the brightness enhancement film layer 214, the prismatic light guide layer 216, the light guide plate layer 218, and the reflector layer 222 discussed above with reference to FIG. 2. In addition, the display screen 504 includes blue LED(s) 522 that are similar to (and operate similarly as explained above for) the blue LED(s) 220 discussed above with reference to FIG. 2. However, in contrast to the display screen stack provided in the display screen 204 of the display device 200, the display screen stack in the display screen 504 includes a bottom polarizer layer 512 that is similar to (and operates similarly as explained above for) the bottom polarization layer 212 that is discussed above with reference to FIG. 2, but that does not include the blue filter 212a deposited on it surface or provided via doping, along with a top polarizer layer 506 that may be modified (as indicated by element 507) to include a blue filter layer that replaces the conventional TAC sub-layer that is typically included in such top polarizer layers (as discussed below with regard to FIG. 5B), or to include a blue filter layer that replaces the conventional TAC sub-layer (that is typically included in such top polarizer layers) along with a doped TAC sub-layer (as discussed below with regard to FIG. 5C.)

With reference to FIG. 5B, one embodiment of the top polarizer layer 506 in the display device 500 of FIG. 5A is illustrated. In that embodiment, the top polarizer layer 506 includes an Optically Clear Adhesive (OCA) sub-layer 507a, a blue filter sub-layer 507b that is located adjacent the OCA sub-layer 507a and that replaces a Tri-Acetate Cellulose (TAC) sub-layer that is found in conventional polarizer layers, a PolyVinyl Alcohol (PVA) protective sub-layer 507c that is located adjacent the blue filter sub-layer 507b, a Tri-Acetate Cellulose (TAC) sub-layer 507d that is located adjacent the PVA protective sub-layer 507c, and an Optically Clear Adhesive (OCA) sub-layer 507e that is located adjacent the TAC layer 507d and that may engage a color filter glass sub-layer 507f in the color filter layer 508.

With reference to FIG. 5C, another embodiment of the top polarizer layer 506 in the display device 500 of FIG. 5A is illustrated. In that embodiment, the top polarizer layer 506 includes the Optically Clear Adhesive (OCA) sub-layer 507a, the blue filter sub-layer 507b, the PolyVinyl Alcohol (PVA) protective sub-layer 507c, and the Optically Clear Adhesive (OCA) sub-layer 507e that engages the color filter glass sub-layer 507f in the color filter layer 508, as discussed above with reference to FIG. 5B. However, in the top polarizer layer 506 illustrated in FIG. 5C, the Tri-Acetate Cellulose (TAC) sub-layer 507d discussed above with reference to FIG. 5C has been replaced with a doped Tri-Acetate Cellulose (TAC) sub-layer 507g. For example, the doped Tri-Acetate Cellulose (TAC) sub-layer 507g in the top polarizer layer 506 of FIG. 5C may be provided by doping a TAC sub-layer with materials such as phosphor, quantum dots, and/or other blue filtering doping materials via a 10-100 nanometer nanoparticle diffusion process, and/or a variety of other doping processes that would be apparent to one of skill in the art in possession of the present disclosure.

Figure 6:
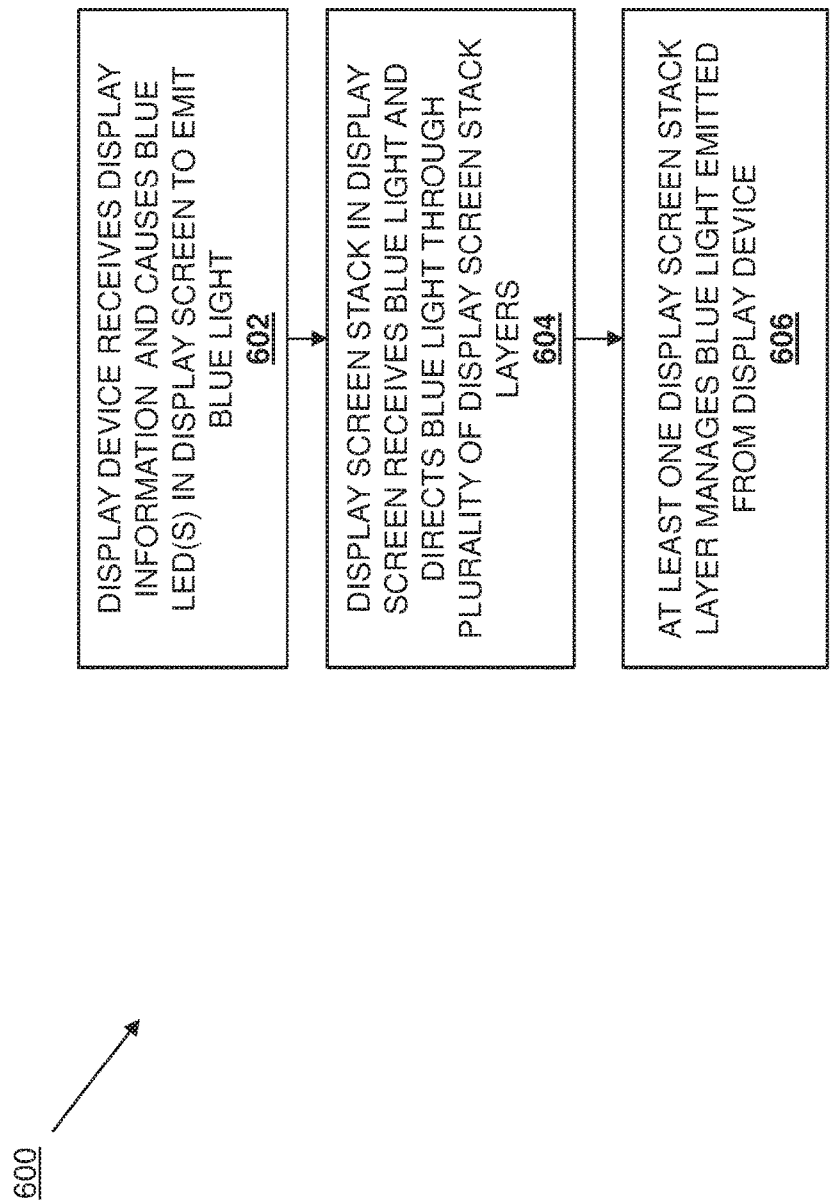
FIG. 6 is a flow chart illustrating an embodiment of a method for managing blue light emissions from a display device.

Referring now to FIG. 6, an embodiment of a method 600 for managing blue light emission from a display device is illustrated. As discussed below, the systems and methods of the present disclosure provide for the management of blue light emissions from a display device without the associated display device thickness increases, reduced display efficiencies, color dilution, and light loss that results from conventional blue light filters provided in conventional display devices. As discussed below, the present disclosure provides a variety of different embodiments for achieving these results, including a blue filter provided on a polarizer layer in the display screen stack via doping of that polarizer layer or deposition on a surface of that polarizer layer, a blue filter provided on a prismatic light guide layer in the display screen stack via doping of that prismatic light guide layer or deposition on a surface of that prismatic light guide layer, via doping of a prismatic light guide layer in the display screen in combination with a reflective layer in a brightness enhancement layer in the display screen stack, a blue filter replacing a TAC sub-layer in the bottom polarizer layer in the display screen stack, and a blue filter replacing a TAC sub-layer in the bottom polarizer layer in the display screen stack in combination with a doped TAC layer in the bottom polarizer layer in the display screen stack. However, one of skill in the art will recognize that combinations of the embodiments discussed below may be utilized to provide similar functionality as well while remaining within the scope of the present disclosure.

The method 600 begins at block 602 where a display device receives display information and causes blue LEDs in its display screen to emit blue light. In an embodiment, at block 602, a processing system coupled to any of the display devices 200, 300, 400, or 500 discussed above may execute instructions included on a memory system in order to generate display information, and provide that display information to that display device (e.g., via one or more physical or wireless couplings or communication systems.) The display information is then received by that display device and provided to its display screen (e.g., the display screens 204, 304, 404, or 504). As would be understood by one of the skill in the art in possession of the present disclosure, the display screens may be configured to utilize the display information to activate blue LED(s) (e.g., the blue LED(s) 220, 320, 420, or 520) and cause those blue LED(s) to emit blue light (e.g., blue light photons generated in response to power provided to the blue LED(s)). While the discussions above involve blue LED(s) emitting solely blue light, in some embodiments, the blue LED(s) utilized in the display devices of the present disclosure may be coated with yellow phosphor material that operates to convert some of the blue light emitted by the blue LED(s) to yellow light (i.e., a combination of red light and green light), while allowing some of the blue light emitted by the blue LED(s) to pass.

The method 600 then proceeds to block 604 where a display screen stack in the display screen receives the blue light and directs the blue light through a plurality of display screen stack layers. In an embodiment, at block 604, the blue light emitted by the blue LED(s) (e.g., the blue LED(s) 220, 320, 420, or 520) in the display device is directed into the light guide plate layer (e.g., the light guide plate layers 218, 318, 418, or 518, respectively) in the display device. As discussed above, and as would be understood by one of skill in the art in possession of the present disclosure, the light guide plate layer is configured to propagate the blue light received from the blue LED(s) via total internal reflection, and distribute that blue light such that it exits the light guide plate layer across the surface of the light guide plate layer that is adjacent the prismatic light guide layer (e.g., the prismatic light guide layers 216, 316, 416, or 516). Furthermore, as also discussed above and as would be understood by one of skill in the art in possession of the present disclosure, the reflector layer (e.g., the reflector layer 222, 322, 422, and 522) is configured to reflect blue light that is propagated through the light guide plate layer such that it eventually exits the light guide plate layer across the surface of the light guide plate layer that is adjacent the prismatic light guide layer. As such, blue light received from the blue LED(s) by the light guide plate layer is directed towards the "upper" layers of the display screen stack (e.g., the prismatic light guide layer, the brightness enhancement film layer, the bottom polarizer layer, the liquid crystal layer, the color filter layer, and the top polarizer layer.)

The method 600 then proceeds to block 606 where at least one display screen stack layer manages blue light emitted from the display device. As discussed above, the present disclosure envisions several different embodiments for managing blue light emissions from a display device to reduce the amount of blue light photons that exit the display screen and are absorbed by a user, and the operation of a few of those embodiments according to block 606 are described separately below. However, combinations of those embodiments may provide benefits as well, as thus are envisioned as falling within the scope of the present disclosure.

With reference to the display device 200 discussed above with reference to FIG. 2, in an embodiment of block 606, the blue light exiting the light guide plate layer 218 at block 604 first enters the prismatic light guide layer 216 which may direct that blue light through the brightness enhancement film layer 214 while guiding it towards the surface of the display screen stack and dispersing it uniformly across the display screen. The brightness enhancement film layer 214 then manages the angular output of the blue light by refracting any portion of that blue light that moves through the brightness enhancement film layer 214 within a viewing cone/angle to the bottom polarizer layer 212, and reflecting any portion of that blue light that is outside the viewing cone/angle back to the reflector layer 222 for "recycling" until that portion of the blue light enters the brightness enhancement film layer 214 within the viewing cone/angle such that it is allowed to pass to the bottom polarizer layer 212.

The bottom polarizer layer 212 then acts as an optical filter that only allows a portion of the blue light having a particular polarization to pass through to the liquid crystal layer 210, while blocking portions of the blue light having other polarizations. In addition, the blue filter 212a operates to filter the blue light and convert that blue light to red light and/or green light before passing that red light and/or green light to the liquid crystal layer 210. For example, when the blue filter 212a is provided as one or more doped portions of the bottom polarizer layer 212, the filtering of the blue light to convert it to red light and/or green light may occur prior to, simultaneous with, or immediately following the polarization of the blue light (or the red light and/or green light converted from that blue light). In another example, when the blue filter 212a is provided as a deposited blue filter on surface of the bottom polarizer layer 212, the filtering of the blue light to convert it to red light and/or green light may occur prior to the polarization of the blue light (e.g., when the blue filter is deposited on the surface of the bottom polarizer layer 212 that is adjacent the brightness enhancement film layer 214), or following the polarization of the red light and/or green light converted from the blue light (e.g., when the blue filter is deposited on the surface of the bottom polarizer layer 212 that is adjacent the liquid crystal layer 210). As will be appreciated by one of skill in the art in possession of the present disclosure, the blue filter 212a in this embodiment differs from conventional blue filters by enabling the filtering of blue light from display devices in the 400-450 nm wavelength range, while providing for thinner display devices. In specific examples, the blue filter 212a may filter blue light in the 420 nm range.

The red light and/or green light is then passed to the liquid crystal layer 210, which has its liquid crystal molecules for each pixel in the display screen 204 oriented via the application of an electrical field (e.g., a voltage across the liquid crystal molecule) that is based on the display information received by the display screen 204, and which operates to control the amount of the red light and/or green light that is passed through to the color filter layer 208. The red, green, and blue filters provided in the color filter layer 208 for each sub-pixel that is part of a pixel on the display screen 204 then operate to define the color that is emitted to the top polarizer layer 206 by their respective pixel using the red light and/or green light received from the liquid crystal layer 210. The top polarizer layer 206 then acts as an optical filter that only allows a portion of the light received from the color filter layer 208 having a particular polarization (e.g., typically a polarization that is rotated 90 degrees relative to the polarization of the bottom polarization layer 212) to pass out of the display screen 204, while blocking portions of that light having other polarizations. Thus, as will be appreciated by one of skill in the art in possession of the present disclosure, the embodiment of the display device 200 illustrated in FIG. 2 provides for the management of blue light emissions by providing for the filtering of blue light while providing improvement over conventional blue light management systems such as by providing thinner display devices that filter blue light in a narrower range that does not degrade the optical properties (brightness, color quality, etc.) of the display device.

With reference to the display device 300 discussed above with reference to FIG. 3, in an embodiment of block 606, the blue light exiting the light guide plate layer 318 at block 604 first enters the prismatic light guide layer 316 which may direct that blue light through the brightness enhancement film layer 214 while guiding it towards the surface of the display screen stack and dispersing it uniformly across the display screen. In addition, the blue filter 316a operates to filter the blue light and convert that blue light to red light and/or green light before passing that red light and/or green light to the brightness enhancement film layer 314. For example, when the blue filter 316a is provided as one or more doped portions of the prismatic light guide layer 316, the filtering of the blue light to convert it to red light and/or green light may occur prior to, simultaneous with, or immediately following the guiding of the blue light (or the red light and/or green light converted from that blue light) towards the surface of the display screen stack and dispersing it uniformly across the display screen. In another example, when the blue filter 316a is provided as a deposited blue filter on surface of the prismatic light guide layer 316, the filtering of the blue light to convert it to red light and/or green light may occur prior to the guiding of the blue light (e.g., when the blue filter is deposited on the surface of the prismatic light guide layer 316 that is adjacent the light guide plate layer 318) towards the surface of the display screen stack and dispersing it uniformly across the display screen, or following the guiding of the red light and/or green light converted from the blue light towards the surface of the display screen stack and dispersing it uniformly across the display screen (e.g., when the blue filter is deposited on the surface of the prismatic light guide layer 316 that is adjacent the brightness enhancement film layer 314). As will be appreciated by one of skill in the art in possession of the present disclosure, the blue filter 316a in this embodiment differs from conventional blue filters by enabling the filtering of blue light from display devices in the 400-450 nm wavelength range, while providing for thinner display devices. In specific examples, the blue filter 316a may filter blue light in the 420 nm range.

The brightness enhancement film layer 314 then manages the angular output of the light received from the prismatic light guide layer 316 by refracting any portion of that light that moves through the brightness enhancement film layer 314 within a viewing cone/angle to the bottom polarizer layer 312, and reflecting any portion of that light that is outside the viewing cone/angle back to the reflector layer 322 for "recycling" until that portion of the light enters the brightness enhancement film layer 314 within the viewing cone/angle such that it is allowed to pass to the bottom polarizer layer 312.

The bottom polarizer layer 312 then acts as an optical filter that only allows a portion of the light passed by the brightness enhancement film layer 312 having a particular polarization to pass through to the liquid crystal layer 310, while blocking portions of that light having other polarizations. That light is then passed to the liquid crystal layer 310, which has its liquid crystal molecules for each pixel in the display screen 304 oriented via the application of an electrical field (e.g., a voltage across the liquid crystal molecule) that is based on the display information received by the display screen 304, which operates to control the amount of that light that is passed through to the color filter layer 308. The red, green, and blue filters provided in the color filter layer 308 for each sub-pixel that is part of a pixel on the display screen 304 then operate to define the color that is emitted to the top polarizer layer 306 by their respective pixel using the light received from the liquid crystal layer 310. The top polarizer layer 306 then acts as an optical filter that only allows a portion of the light received from the color filter layer 308 having a particular polarization (e.g., typically a polarization that is rotated 90 degrees relative to the polarization of the bottom polarization layer 312) to pass out of the display screen 304, while blocking portions of that light having other polarizations. Thus, as will be appreciated by one of skill in the art in possession of the present disclosure, the embodiment of the display device 300 illustrated in FIG. 3 provides for the management of blue light emissions by providing for the filtering of blue light while providing improvement over conventional blue light management systems such as by providing thinner display devices that filter blue light in a narrower range that does not degrade the optical properties (brightness, color quality, etc.) of the display device.

Figure 7:
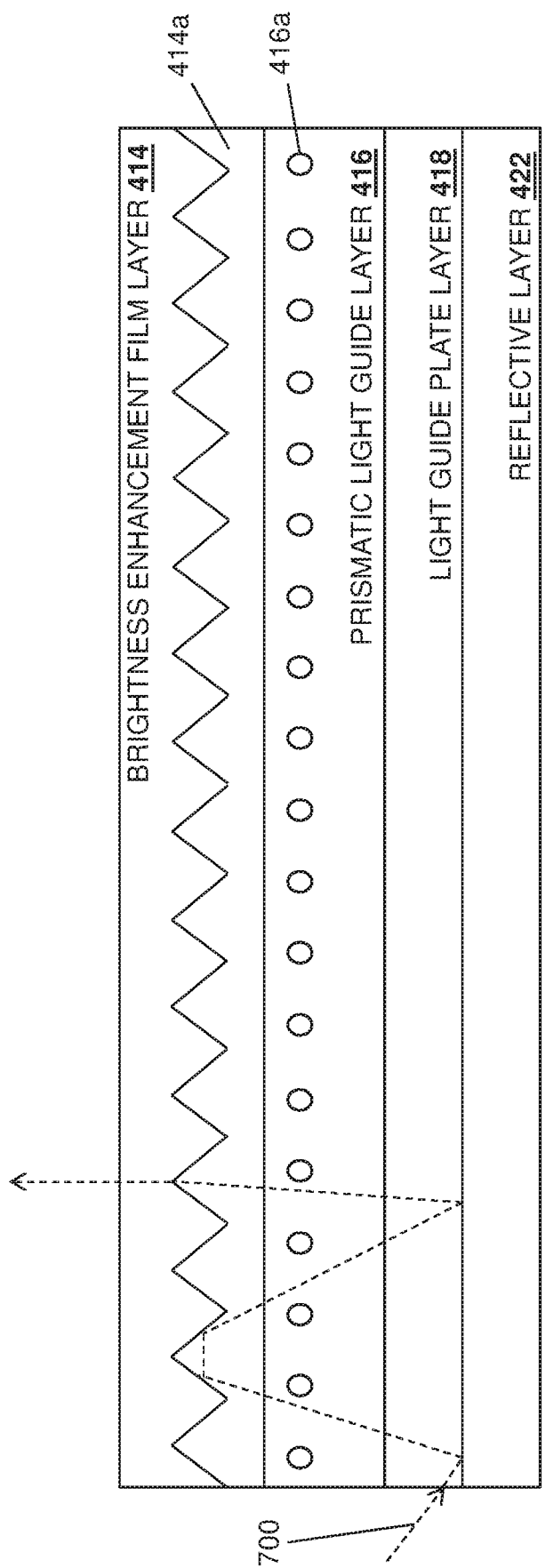
FIG. 7 is a schematic view illustrating an embodiment of blue light management in the display device of FIGS. 4A and 4B.

Referring now to FIG. 7, and with reference to the display device 400 discussed above with reference to FIGS. 4A and 4B, in an embodiment of block 606, the blue light 700 exiting the light guide plate layer 418 at block 604 first enters the prismatic light guide layer 416 which may direct that blue light through the brightness enhancement film layer 214 while guiding it towards the surface of the display screen stack and dispersing it uniformly across the display screen. Furthermore, FIG. 7 illustrates how the blue light 700 may enter the light guide plate layer 418 and be reflected by the reflective layer 422 before exiting the light guided plate layer 418 and entering the prismatic light guide layer 416. In addition to the prismatic light guide layer 416 operating to guide the blue light 700 towards the surface of the display screen stack and dispersing it uniformly across the display screen, the doping 416a (e.g., phosphor, quantum dots, etc.) provided in the prismatic light guide layer 416 operates to convert a portion of the blue light 700 passing through the prismatic light guide layer 416 to at least one of red light and/or green light before allowing that light to pass to the brightness enhancement film layer 414. As will be appreciated by one of skill in the art in possession of the present disclosure, the doping 416a in this embodiment differs from conventional blue filters by enabling the filtering of blue light from display devices in the 400-450 nm wavelength range, while providing for thinner display devices. In specific examples, the blue filter 416a may filter blue light in the 420 nm range.

The brightness enhancement film layer 414 then manages the angular output of the light received from the prismatic light guide layer 416 by refracting any portion of that light that moves through the brightness enhancement film layer 414 within a viewing cone/angle to the bottom polarizer layer 412. In addition, FIG. 7 illustrates how light (blue light not converted by the doping 416a of the prismatic light guide layer 416, red light and/or green light converted from blue light by the doping 416a of the prismatic light guide layer 416, etc.) that is outside the viewing cone/angle back to the reflector layer 422 for "recycling" until that light enters the brightness enhancement film layer 414 within the viewing cone/angle such that it is allowed to pass to the bottom polarizer layer 412. In addition, when the light that is reflected by the reflective layer 422 passes back though the prismatic light guide layer 416 (as illustrated in FIG. 7), the doping 416a (e.g., phosphor, quantum dots, etc.) provided in the prismatic light guide layer 416 again operates to convert portions of any remaining blue light passing through the prismatic light guide layer 416 to at least one of red light and/or green light before allowing that light to pass to the brightness enhancement film layer 414.

The bottom polarizer layer 412 then acts as an optical filter that only allows a portion of the light passed by the brightness enhancement film layer 412 having a particular polarization to pass through to the liquid crystal layer 410, while blocking portions of that light having other polarizations. That light is then passed to the liquid crystal layer 410, which has its liquid crystal molecules for each pixel in the display screen 404 oriented via the application of an electrical field (e.g., a voltage across the liquid crystal molecule) that is based on the display information received by the display screen 404, which operates to control the amount of that light that is passed through to the color filter layer 408. The red, green, and blue filters provided in the color filter layer 408 for each sub-pixel that is part of a pixel on the display screen 404 then operate to define the color that is emitted to the top polarizer layer 406 by their respective pixel using the light received from the liquid crystal layer 410. The top polarizer layer 406 then acts as an optical filter that only allows a portion of the light received from the color filter layer 408 having a particular polarization (e.g., typically a polarization that is rotated 90 degrees relative to the polarization of the bottom polarization layer 412) to pass out of the display screen 404, while blocking portions of that light having other polarizations. Thus, as will be appreciated by one of skill in the art in possession of the present disclosure, the embodiment of the display device 400 illustrated in FIG. 4 provides for the management of blue light emissions by providing for the filtering of blue light while providing improvement over conventional blue light management systems such as by providing thinner display devices that filter blue light in a narrower range that does not degrade the optical properties (brightness, color quality, etc.) of the display device.

With reference to the display device 500 discussed above with reference to FIG. 5A, in an embodiment of block 606, the blue light exiting the light guide plate layer 518 at block 604 first enters the prismatic light guide layer 516 which may direct that blue light through the brightness enhancement film layer 514 while guiding it towards the surface of the display screen stack and dispersing it uniformly across the display screen. The brightness enhancement film layer 514 then manages the angular output of the blue light by refracting any portion of that blue light that moves through the brightness enhancement film layer 514 within a viewing cone/angle to the bottom polarizer layer 512, and reflecting any portion of that blue light that is outside the viewing cone/angle back to the reflector layer 522 for "recycling" until that portion of the blue light enters the brightness enhancement film layer 514 within the viewing cone/angle such that it is allowed to pass to the bottom polarizer layer 512.

The bottom polarizer layer 512 then acts as an optical filter that only allows a portion of the blue light having a particular polarization to pass through to the liquid crystal layer 210, while blocking portions of the blue light having other polarizations. The liquid crystal layer 510 has its liquid crystal molecules for each pixel in the display screen 504 oriented via the application of an electrical field (e.g., a voltage across the liquid crystal molecule) that is based on the display information received by the display screen 504, which operates to control the amount of the blue light that is passed through to the color filter layer 508. The red, green, and blue filters provided in the color filter layer 508 for each sub-pixel that is part of a pixel on the display screen 504 then operate to define the color that is emitted to the top polarizer layer 506 by their respective pixel using the blue light received from the liquid crystal layer 510. The top polarizer layer 506 then acts as an optical filter that only allows a portion of the light received from the color filter layer 508 having a particular polarization (e.g., typically a polarization that is rotated 90 degrees relative to the polarization of the bottom polarization layer 512) to pass out of the display screen 504, while blocking portions of that light having other polarizations. In addition, the modified portion 507 of the top polarizer layer 506 then operates to manage blue light emitted from the display screen 504, as described in the examples below.

In one example, with reference to FIG. 5B, the blue light entering the top polarizer layer 506 from the color filter layer 508 passes through the color filter glass sub-layer 507*f*, the optically clear adhesive sub-layer 507*e*, the tri-acetate cellulose sub-layer 507*d*, and the polyvinyl alcohol protective sub-layer 507*c*, before it enters the blue filter sub-layer 507*b*. The blue filter sub-layer 507*b* then operates to convert that blue light to at least one of red light and/or green light, and passes that red light and/or green light to the optically clear adhesive sub-layer 507*a* before it exits the display screen 506. As will be appreciated by one of skill in the art in possession of the present disclosure, the blue filter sub-layer 507*b* in this embodiment differs from conventional blue filters by enabling the filtering of blue light from display devices in the 400-450 nm wavelength range, while providing for thinner display devices. In specific examples, the blue filter 416*a* may filter blue light in the 420 nm range. Thus, as will be appreciated by one of skill in the art in possession of the present disclosure, the embodiment of the display device 500 illustrated in FIGS. 5A and 5B provides for the management of blue light emissions by providing for the filtering of blue light while providing improvement over conventional blue light management systems such as by providing thinner display devices that filter blue light in a narrower range that does not degrade the optical properties (brightness, color quality, etc.) of the display device.

In another example, with reference to FIG. 5C, the blue light entering the top polarizer layer 506 from the color filter layer 508 passes through the color filter glass sub-layer 507*f* and the optically clear adhesive sub-layer 507*e*, before entering the doped tri-acetate cellulose sub-layer 507*g*. The doping of the doped tri-acetate cellulose sub-layer 507*g* operates to convert a portion of the blue passing through the doped tri-acetate cellulose sub-layer 507*g* to at least one of red light and/or green light, which passes through to the polyvinyl alcohol protective sub-layer 507*c* before it enters the blue filter sub-layer 507*b*. The blue filter sub-layer 507*b* then operates to convert a portion of the blue light to at least one of red light and/or green light, and passes that red light and/or green light to the optically clear adhesive sub-layer 507*a* before it exits the display screen 506. In addition, the blue filter sub-layer 507*b* may be configured to reflect blue light back to the doped tri-acetate cellulose layer 507*g* for further blue light conversion to red light and/or green light. For example, an air layer between blue filter sub-layer 507*b* and the polyvinyl alcohol protective sub-layer 507*c* (e.g., rather than a glue layer) may be utilized to provide such reflective properties, and a similar reflective functionality may be provided between the doped tri-acetate cellulose layer 507*g* and the optically clear adhesive sub-layer 507*e* in order to reflect light back out of the display screen 504. As will be appreciated by one of skill in the art in possession of the present disclosure, the blue filter sub-layer 507*b* in this embodiment differs from conventional blue filters by performing enabling the filtering of blue light from display devices in the 400-450 nm wavelength range, while providing for thinner display devices. In specific examples, the blue filter 416a may filter blue light in the 420 nm range. Thus, as will be appreciated by one of skill in the art in possession of the present disclosure, the embodiment of the display device 500 illustrated in FIGS. 5A and 5C provides for the management of blue light emissions by providing for the filtering of blue light while providing improvement over conventional blue light management systems such as by providing thinner display devices that filter blue light in a narrower range that does not degrade the optical properties (brightness, color quality, etc.) of the display device.

Thus, systems and methods have been described that provide for the management of blue light emissions from a display device without the associated display device thickness increases, reduced display efficiencies, color dilution, and light loss associated with conventional blue light filters provided in conventional display devices. As discussed above, such results may be achieved via a blue filter deposited on or doped in a polarizer layer in the display screen stack, a blue filter deposited on or doped in a prismatic light guide layer in the display screen stack, a doped prismatic light guide layer in the display screen in combination with a reflective layer in a brightness enhancement layer in the display screen stack, a blue filter replacing a TAC sub-layer in the top polarizer layer in the display screen stack, or a blue filter replacing a TAC sub-layer in the top polarizer layer in the display screen stack in combination with a doped TAC layer in the top polarizer layer in the display screen stack.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A blue light emissions management system, comprising:
    a blue light emitting device that is configured to emit blue light; and
    a display screen stack that is located adjacent the blue light emitting device and that is configured to receive blue light emitted from the blue light emitting device, wherein the display screen stack includes a first doped layer that includes a first doping material in a doping amount that configures the first doped layer to convert a first portion of the blue light received by the display screen stack to at least one of red light and green light, and wherein the first doped layer included in the display screen stack has a thickness of no more than 20 nanometers.

2. The system of claim 1, wherein the display screen stack includes a blue filter layer that is configured to filter a second portion of the blue light that passes through the first doped layer.

3. The system of claim 2, wherein the blue filter layer is configured to reflect a third portion of the blue light that passes through the first doped layer back through the first doped layer.

4. The system of claim 3, wherein the display screen stack includes a reflective layer that is located opposite the first doped layer from the blue filter layer, and wherein the reflective layer is configured to reflect, back through the first doped layer, the third portion of the blue light that was reflected by the blue filter layer back through the first doped layer.

5. The system of claim 1, wherein a polarizer layer that includes the first doped layer includes a single Tri-Acetate Cellulose (TAC) layer.

6. The system of claim 1, wherein the display screen stack includes a second doped layer that includes a second doping material in a doping amount that configures the second doped layer to convert a second portion of the blue light received by the display screen stack to at least one of red light and green light, and wherein the second doped layer includes a prismatic light guide layer.

7. An Information Handling System (IHS), comprising:
    a processing system;
    a memory system that is coupled to the processing system and that includes instructions that, when executed by the processing system, cause the processing system to generate display information; and
    a display device that is coupled to the processing system and that is configured to receive the display information, wherein the display device includes:
        a blue light emitting device that is configured to emit blue light in order to provide for display of the display information; and
        a display screen stack that is located adjacent the blue light emitting device and that is configured to receive blue light emitted from the blue light emitting device, wherein the display screen stack includes a polarizer layer that includes a PolyVinyl Alcohol (PVA) protective sub-layer that is positioned between a Tri-Acetate Cellulose (TAC) sub-layer and a first doped sub-layer that includes a first doping material in a doping amount that configures the first doped layer to convert a first portion of the blue light received by the display screen stack to at least one of red light and green light, and wherein the TAC sub-layer is configured to receive the blue light before the first doped sub-layer.

8. The IHS of claim 7, wherein the display screen stack includes a blue filter layer that is configured to filter a second portion of the blue light prior to the blue light passing through the first doped sub-layer.

9. The IHS of claim 8, wherein the blue filter layer includes a brightness enhancement film layer.

10. The IHS of claim 7, wherein the first doped sub-layer has a thickness of no more than 20 nanometers.

11. The IHS of claim 7, wherein the polarizer layer includes an optically clear adhesive sub-layer, and wherein the first doped sub-layer is positioned between the optically clear adhesive sub-layer and the PVA protective sub-layer.

12. The IHS of claim 7, wherein the (TAC) sub-layer is doped with a blue filtering doping material.

13. The IHS of claim 7, wherein the display screen stack includes a second doped layer that includes a second doping material in a doping amount that configures the second doped layer to convert a second portion of the blue light received by the display screen stack to at least one of red light and green light, and wherein the second doped layer includes a prismatic light guide layer.

14. A method for managing blue light emissions from a display device, comprising:
    emitting, by a blue light emitting device in a display device, blue light;
    receiving, by a display screen stack that is located adjacent the blue light emitting device in the display device, the blue light emitted from the blue light emitting diode; and
    converting, by a first doped layer in the display screen stack that includes a first doping material in a doping amount and that has a thickness of no more than 20 nanometers, a first portion of the blue light received by the display screen stack to at least one of red light and green light that is based on the doping amount of the first doping material.

15. The method of claim 14, further comprising:
filtering, by a blue filter layer in the display screen stack, a second portion of the blue light that passes through the first doped layer.

16. The method of claim 15, wherein the blue filter layer includes a brightness enhancement film layer.

17. The method of claim 15, further comprising:
reflecting, by the blue filter layer, a third portion of the blue light that passes through the first doped layer back through the first doped layer.

18. The method of claim 17, further comprising:
reflecting, by a reflective layer that is located in the display screen stack opposite the first doped layer from the blue filter layer and back through the first doped layer, the third portion of the blue light that was reflected by the blue filter layer back through the first doped layer.

19. The method of claim 14, wherein a polarizer layer that includes the first doped layer includes a single Tri-Acetate Cellulose (TAC) layer.

20. The method of claim 14, further comprising:
converting, by a second doped layer in the display screen stack that includes a second doping material in a doping amount, a second portion of the blue light received by the display screen stack to at least one of red light and green light that is based on the doping amount of the second doping material, and wherein the second doped layer includes a prismatic light guide layer.

* * * * *